(12) United States Patent
Lihl et al.

(10) Patent No.: US 11,311,886 B2
(45) Date of Patent: Apr. 26, 2022

(54) HOLDING APPARATUS FOR SAMPLE CARRIERS, AND METHOD FOR INTRODUCING AND WITHDRAWING A SAMPLE CARRIER

(71) Applicant: Leica Mikrosysteme GmbH, Vienna (AT)

(72) Inventors: Reinhard Lihl, Vienna (AT); Leander Gaechter, Oberriet SG (CH); Saskia Mimietz-Oeckler, Röthlein (DE)

(73) Assignee: LEICA MIKROSYSTEME GMBH, Vienna (AT)

( * ) Notice: Subject to any disclaimer, the term of this patent is extended or adjusted under 35 U.S.C. 154(b) by 951 days.

(21) Appl. No.: 15/943,763

(22) Filed: Apr. 3, 2018

(65) Prior Publication Data

US 2018/0290144 A1    Oct. 11, 2018

(30) Foreign Application Priority Data

Apr. 5, 2017 (EP) ..................... 17165006

(51) Int. Cl.
*B01L 9/00* (2006.01)
*G02B 21/34* (2006.01)
(Continued)

(52) U.S. Cl.
CPC ...... *B01L 9/50* (2013.01); *B01L 7/50* (2013.01); *B01L 9/52* (2013.01); *G02B 21/26* (2013.01); *G02B 21/34* (2013.01); *B01L 2200/025* (2013.01); *B01L 2300/041* (2013.01); *B01L 2300/0609* (2013.01)

(58) Field of Classification Search
CPC .... B01L 9/52; B01L 9/527; B01L 2300/0809; B01L 2300/0819; B01L 2300/0822; G02B 21/34; G01N 2035/00138
See application file for complete search history.

(56) References Cited

U.S. PATENT DOCUMENTS

| | | | | |
|---|---|---|---|---|
| 4,159,875 A | * | 7/1979 | Hauser | B01L 3/545 356/244 |
| 4,501,495 A | * | 2/1985 | Faulkner | G02B 21/34 356/244 |

(Continued)

FOREIGN PATENT DOCUMENTS

| | | |
|---|---|---|
| CN | 2854576 Y | 1/2007 |
| CN | 101221882 A | 7/2008 |

(Continued)

*Primary Examiner* — Jill A Warden
*Assistant Examiner* — Dwayne K Handy
(74) *Attorney, Agent, or Firm* — Hodgson Russ LLP

(57) ABSTRACT

The invention relates to a holding apparatus (100) for sample carriers (200) for use in cryomicroscopy, encompassing: a body having at least one sample carrier receptacle that comprises at least one sample carrier support surface against which at least one sample carrier (200) is abuttable; at least one first sample carrier holding means (121); and at least one second sample carrier holding means (131) that is configured to impinge upon the sample carrier (200) with force against the first sample carrier holding means (121); and to an arrangement having a manipulation container and such a holding apparatus (100), and to methods for introducing and withdrawing a sample carrier (200).

15 Claims, 5 Drawing Sheets

(51) Int. Cl.
*G02B 21/26* (2006.01)
*B01L 7/00* (2006.01)

(56) References Cited

U.S. PATENT DOCUMENTS

| | | |
|---|---|---|
| 8,395,130 B2 | 3/2013 | Gaechter |
| 2002/0131167 A1 | 9/2002 | Nguyen et al. |
| 2003/0138353 A1 | 7/2003 | Bargoot et al. |
| 2007/0122834 A1 | 5/2007 | Sugiyama et al. |
| 2007/0128071 A1 | 6/2007 | Shea et al. |
| 2012/0132828 A1* | 5/2012 | Gachter ............ H01J 37/20 250/440.11 |
| 2016/0030941 A1 | 2/2016 | Lihl et al. |
| 2017/0160532 A1 | 6/2017 | Thomas et al. |

FOREIGN PATENT DOCUMENTS

| | | |
|---|---|---|
| CN | 103196404 A | 7/2013 |
| CN | 106423337 A | 2/2017 |
| DE | 8019943 U1 | 10/1980 |
| DE | 102014110724 B4 | 9/2016 |
| EP | 1171761 A1 | 1/2002 |
| WO | 20160016000 A1 | 2/2016 |

\* cited by examiner

B-B

C-C

HOLDING APPARATUS FOR SAMPLE CARRIERS, AND METHOD FOR INTRODUCING AND WITHDRAWING A SAMPLE CARRIER

CROSS REFERENCE TO RELATED APPLICATIONS

This application claims priority of European patent application number 17165006.2 filed Apr. 5, 2017, the entire disclosure of which is incorporated by reference herein.

FIELD OF THE INVENTION

The present invention relates to a holding apparatus for sample carriers for use in cryomicroscopy, and to methods for introducing a sample carrier into, and withdrawing it from, such a holding apparatus.

BACKGROUND OF THE INVENTION

Cryofixation is a sample preparation method often used in electron microscopy. In this, a water-containing sample is frozen very rapidly to a temperature below $-150°$ C. (cryofixed), i.e. it is cooled very quickly in order to avoid the formation of ice crystals. Cryofixation has proven to be particularly suitable for investigations of structural biology. The specimens to be investigated, for example cells, enzymes, viruses, or lipid layers, are thereby embedded in a thin, vitrified layer of ice. The great advantage of cryofixation is that biological structures can be maintained in their natural state. For example, a biological process can be halted at any arbitrary point in time by cryofixation and investigated in that vitrified state, for example using a cryo-electron microscope and/or in a light microscope with corresponding sample cooling; cryo-light microscopy serves principally for discovering relevant regions in the sample, which regions can be pre-marked and then observed in more detail using a cryo-electron microscope. A light microscope suitable for this purpose is known, for example, from WO 2016/016000 A1.

The frozen samples, which as a rule are located on an electron-microscopy sample carrier known per se, for example a grid or a pin for scanning electron microscopy, must be conveyed, under the aforesaid cryogenic conditions and with water excluded, into corresponding sample carrier mounts or holding apparatuses that can subsequently be conveyed into appropriate holders in the aforesaid microscopes. A typical sample carrier mount for use in conjunction with the present invention has been disclosed, for example, in the document U.S. Pat. No. 8,395,130 B2, in which a grid that constitutes a sample carrier and carries the cryogenic sample can be immobilized in a corresponding mount using clamp elements.

In order not to impair the quality of the frozen samples, it is very important that they be transferred in cooled and contamination-free fashion between the processing devices that are utilized, for example a cryofixation device, freeze fracture apparatus, or coating apparatus, and the analysis devices, here in particular the cryo-light microscope and cryo-electron microscope. DE 10 2014 110 724 B4 discloses for this purpose a manipulation container in which a holder for a sample carrier mount is displaceable.

Handling of the sample carriers is difficult with the known holding apparatuses for sample carriers, however, especially if the holding apparatus is introduced into a manipulation container, in particular because accessibility is greatly restricted.

The object on which the invention is based is therefore that of making available a capability for holding sample carriers, in particular for cryomicroscopy, which enables simple handling of the sample carriers including, especially, in a state introduced into a manipulation container.

SUMMARY AND ADVANTAGES OF THE INVENTION

According to the present invention, a holding apparatus for sample carriers and methods for introducing and withdrawing sample carriers, having the features of described herein, are proposed. Advantageous embodiments are the subject matter of the description below.

A holding apparatus according to the present invention for sample carriers serves for use in cryomicroscopy, i.e. in particular also with the cryo-electron microscopes and cryo-light microscopes mentioned previously, and therein in particular, in each case, in a state introduced into a manipulation container. The sample carriers can in particular be grids that are introduced into a mount. A sample to be investigated can then be or become applied onto the grid.

The holding apparatus comprises a body that comprises at least one sample carrier receptacle having at least one sample carrier support surface against which at least one sample carrier is abuttable. When a sample carrier is abutting against the sample carrier receptacle and thus in particular against the body, good heat transfer can be achieved, which contributes to cooling specifically in the desired cryogenic range. It is preferred if at least two sample carrier receptacles are provided, i.e. sample carriers are each abuttable against a corresponding sample carrier support surface, in particular next to one another, since space can then be utilized appreciably better. The holding apparatus furthermore comprises at least one first sample carrier holding means and at least one second sample carrier holding means. The at least one second sample carrier holding means is configured to impinge upon the sample carrier with force against the first sample carrier holding means. Preferably, the at least one second sample carrier holding means can also be configured to be pressed away from the at least one first sample carrier holding means, i.e. in particular with external application of force, upon positioning of the sample carrier.

Preferably the at least one first sample carrier holding means can be constituted by at least part of an inner wall of the sample carrier receptacle, i.e. the sample carrier is then impinged upon with force, or pressed, by the second sample carrier holding means against the inner wall of the sample carrier receptacle. This makes possible a particularly compact and stable design. In particular, there are fewer components that might possibly be subject to degradation or material fatigue at cryogenic temperatures.

With such a holding apparatus, sample carriers now can not only be held securely, but also can be easily introduced into the holding apparatus and also withdrawn from it again, in particular including with the use of a gripping tool such as a forceps. The correlated first and second holding means produce a kind of clamping of the sample carrier in the holding apparatus. Usefully, the sample carrier is also pressed against the sample carrier support surface, specifically by the first sample carrier holding means and/or by the second sample carrier holding means. The first or second sample carrier holding means can be correspondingly embodied for this purpose, as will be explained later in even greater detail.

If the first sample carrier holding means is constituted by at least part of the inner wall of the sample carrier receptacle, it is in particular stationary, whereas the other is embodied movably, thus promoting not only a simple and stable design, but also in particular simple introduction and withdrawal of sample carriers. Good heat transfer is also possible because the sample carrier or a mount, constituting part of the sample carrier, abuts against the sample carrier support surface.

Preferably the at least one first holding means comprises a projection whose inner surface serves at least in part as a sample carrier abutment surface. Such a projection, or an end point or an edge thereof, can be located above the sample carrier receptacle surface. What can thereby be achieved is that when the sample carrier abuts against the first sample carrier holding means or the sample carrier abutment surface, it is pressed against the sample carrier support surface and is thus held in more stable fashion.

Advantageously, the at least one first sample carrier holding means comprises a first recess, in particular in the form of an undercut, into which the sample carrier is partly introducible. This makes possible simple manufacture of the holding apparatus while at the same time ensuring secure retention and easy introduction of a sample carrier.

It is advantageous if the at least one second sample carrier holding means comprises a spring, in particular a leaf spring. A spring represents a particularly simple component with which a sufficiently large force impingement upon a sample carrier can be ensured. This is true in particular for a leaf spring, which moreover is subject to no, or at least very little, functional impairment even at cryogenic temperatures. A leaf spring of this kind can also be mounted very easily on the body, for example by means of a screw. For the case in which the holding apparatus is embodied for simultaneous reception of several sample carriers, i.e. comprises several sample carrier receptacles, it is also possible to manufacture several leaf springs from a single component, i.e. in particular a single plate, thereby simplifying mounting on the body.

Advantageously, there is provided in the body at least one second recess that is embodied in such a way that a sample carrier abutting against the sample carrier support surface is graspable by means of a grasping tool, for example a suitable forceps or the like. It is useful when the at least one first sample carrier holding means comprises two portions that are arranged alongside the second recess in the body, since uniform clamping of the sample carrier is then possible. Thanks to a second recess of this kind, a sample carrier can then on the one hand be held by means of the grasping tool until, upon introduction, it abuts against the sample carrier support surface or has reached the end position. On the other hand, however, for removal the grasping tool can also very easily be placed around the sample carrier so that it can be securely retained with the grasping tool.

It is advantageous if the holding apparatus is embodied in such a way that it extends toward an abutting sample carrier, in a direction perpendicular to the sample carrier receiving surface, at most over a distance corresponding to a thickness (in the direction perpendicular to the sample carrier support surface) of the sample carrier. In other words, the holding apparatus, i.e. in particular including any of its components such as the first and second sample carrier holding means or the sample carrier receptacle, does not extend beyond an introduced sample carrier. More reliable handling upon introduction and removal of the sample carriers can thereby be achieved. In addition, it is thereby possible to bring, for example, an objective of a microscope closer to, or more optimally against, the sample carrier.

Preferably the at least one sample carrier receptacle is embodied in such a way that the respective sample carrier, when it abuts against the sample carrier support surface, abuts with at least 10%, preferably at least 20%, particularly preferably at least 40%, of a surface facing toward the sample carrier support surface. Additionally or alternatively, the at least one sample carrier receptacle is embodied in such a way that when a mount of the respective sample carrier abuts against the sample carrier support surface, said mount abuts with at least 20%, preferably at least 40%, particularly preferably at least 60%, but also conceivably at least 70% or at least 80%, of a surface facing toward the sample carrier support surface. Particularly good heat transfer, and thus particularly good and effective cooling of the sample carriers and thus of the samples arranged thereon, can thus be achieved.

It is particularly preferred if the holding apparatus is embodied for use with annular sample carriers. Annular sample carriers of this kind can in particular comprise an annular mount. In this case care is to be taken, in particular with regard to the first sample carrier holding means, that they be adapted as well as possible to the external shape of the sample carriers. In the case of two portions of a first sample carrier holding means, those two portions can be arranged accordingly on a circumference. For the preferred case in which the sample carrier receptacle is embodied in the form of a recess in the body, that recess or the sample carrier receptacle can have a substantially round, also elliptical or oval, shape, such that a certain displacement, between a first and second sample carrier holding means, of the sample carrier abutting against the sample carrier support surface should be possible.

Preferably the largest dimension of the holding apparatus is less than 50 mm, in particular less than 20 mm. It is understood that the dimensions should correspond at least to those of the sample carriers. Sample carriers that are used for cryomicroscopy are as a rule relatively small. In the case of annular sample carriers, if the design is substantially flat they usually have a diameter of at most only a few millimeters, for example 3 to 5 mm. It is precisely with such small dimensions that the handling of sample carriers proves to be very difficult, in particular when handling has to take place in a very largely sealed manipulation container and at cryogenic temperatures. The advantages of the proposed holding apparatus, with simple introduction and withdrawal of sample carriers and secure retention thereof, become particularly evident here.

Advantageously, a receptacle for a manipulator for moving the holding apparatus is provided. Particularly simple and more reliable handling of the holding apparatus itself can thus be accomplished.

A further subject of the invention is an arrangement having a manipulation container and a holding apparatus according to the present invention, in which a receptacle for a manipulator for moving the holding apparatus is provided. The manipulation container is embodied in such a way that the holding apparatus can be immobilized therein. Also provided is a manipulator onto which the holding apparatus is, in particular removably, mountable, and with which the holding apparatus is movable in particular within the manipulation container.

With regard to advantages, to avoid repetition reference may be made at this juncture to the statements above regarding the holding apparatus, which apply here accordingly.

A further subject of the invention is a method for introducing a sample carrier into a holding apparatus according to the present invention. For this purpose, the sample carrier is grasped by means of a grasping tool and pressed against a second sample carrier holding means so that that second sample carrier holding means is pressed away from a first sample carrier holding means. The sample carrier is then abutted against the sample carrier support surface and moved onto the first sample carrier holding means until coming to a stop against it. This procedure makes possible simple introduction of a sample carrier into the holding apparatus, the sample carrier then being securely held in the holding apparatus.

A further subject of the invention is a method for withdrawing a sample carrier from a holding apparatus according to the present invention. For this purpose, the sample carrier is moved away from a first sample carrier holding means by means of a grasping tool while being pressed against a second sample carrier holding means. The sample carrier is then lifted away from the sample carrier support surface and withdrawn from the holding apparatus. This procedure makes possible simple withdrawal of a sample carrier from the holding apparatus.

To avoid repetition, regarding further advantages reference may again be made at this juncture to the statements above regarding the holding apparatus.

Further advantages and embodiments of the invention are evident from the description and from the attached drawings.

It is understood that the features recited above and those yet to be explained below are usable not only in the respective combination indicated but also in other combinations or in isolation, without departing from the scope of the present invention.

The invention is schematically depicted in the drawings on the basis of an exemplifying embodiment, and will be described below with reference to the drawings.

BRIEF DESCRIPTION OF THE DRAWING VIEWS

DETAILED DESCRIPTION OF THE INVENTION

Figure 1:
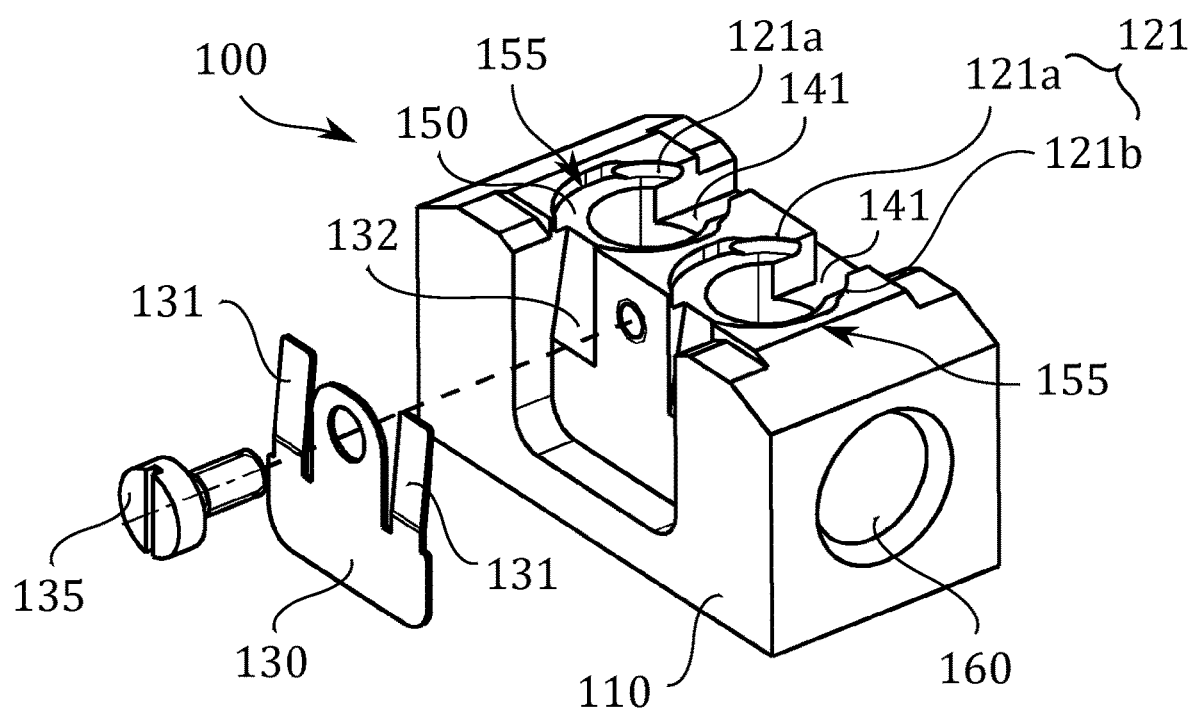
FIG. 1 is an exploded view schematically showing a holding apparatus according to the present invention in a preferred embodiment.
Figure 2:
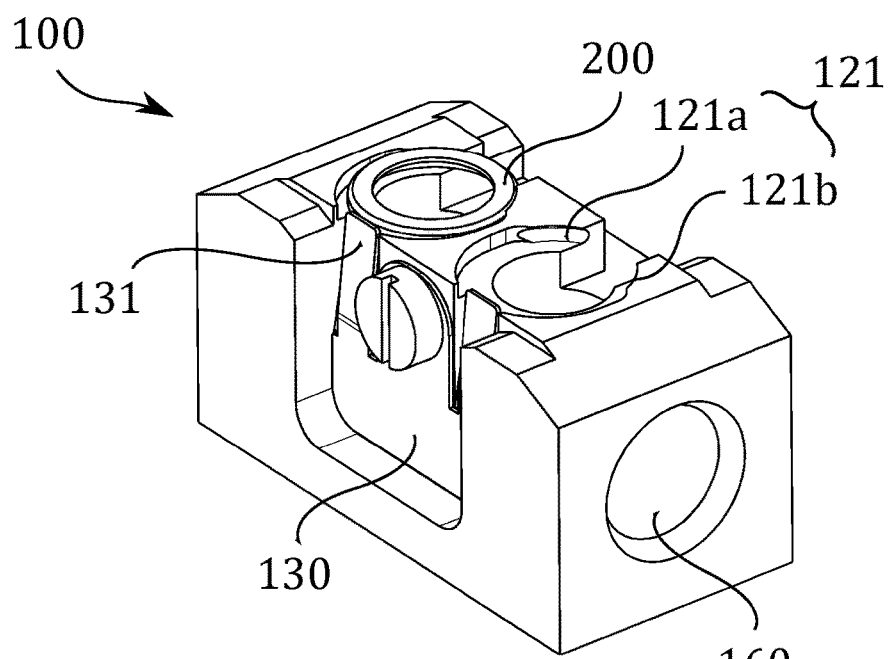
FIG. 2 shows the holding apparatus of FIG. 1 in assembled form, with a sample carrier inserted.
Figure 3:
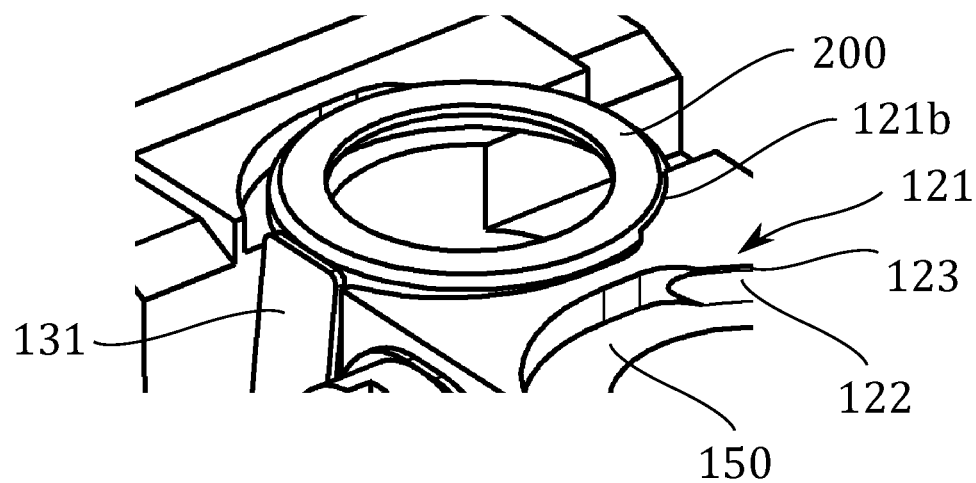
FIG. 3 is an enlarged detail of FIG. 2.
Figure 4:
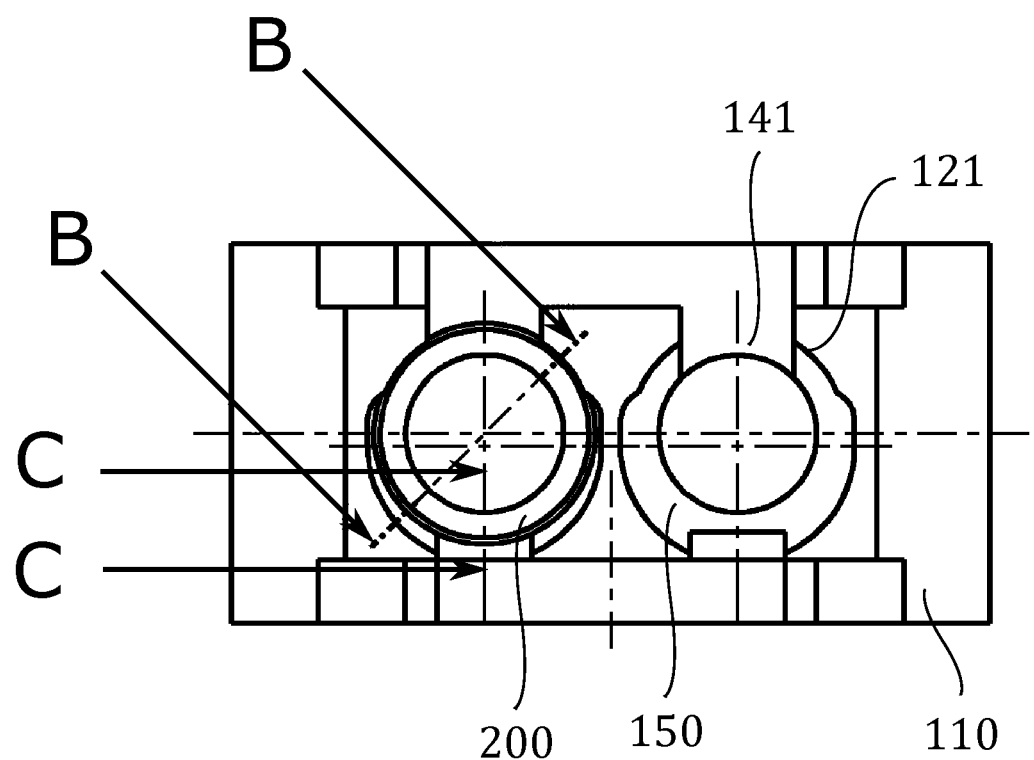
FIG. 4 is a plan view of the holding apparatus of FIG. 1.

FIGS. 1 to 7 schematically depict a holding apparatus according to the present invention for sample carriers, in a preferred embodiment. This holding apparatus 100 will be described in further detail below, with reference to all of FIGS. 1 to 7.

Holding apparatus 100 has a body 110 that here, aside from various recesses and the like, has a substantially cuboidal external shape. In the interior, holding apparatus 100 can also be hollow or can exhibit recesses. Holding apparatus 100 is provided, by way of example, for the reception of two sample carriers 200, one of which is visible in each of FIGS. 2 to 5, and therefore comprises two sample carrier receptacles 155.

Holding apparatus 100 furthermore comprises two first sample carrier holding means 121 that are constituted here by part of an inner wall 122 of sample carrier receptacle 155 and furthermore are embodied, in particular, integrally with body 110. In particular, first sample carrier holding means 121 are embodied with first recesses 125 in the form of undercuts. This is apparent especially clearly from the section views in FIGS. 5 and 6, where FIG. 6 shows the left part of FIG. 5 but without abutting sample carriers.

In particular, first sample carrier holding means 121 comprises here a projection 123 whose outer edge, here labeled P, is located above sample carrier support surface 150. The result is to constitute here a recess 125 that remains at least partly exposed even when a sample carrier is abutting. Sample carrier 200 therefore abuts only with a sample carrier abutment surface 122a that here is part of inner wall 122, and in the region of projection 123. What can also be achieved in this fashion is that sample carrier 200 is held by first sample carrier holding means 121 in such a way that a force or force component acts on sample carrier 200 not only parallel to sample carrier support surface 150 but also perpendicularly thereto. Sample carrier 200 is thus also pressed onto, or compressed against, sample carrier support surface 150 by first sample carrier holding means 121, and thus also prevented from falling out if the holding apparatus is, for example, rotated.

Figure 5:
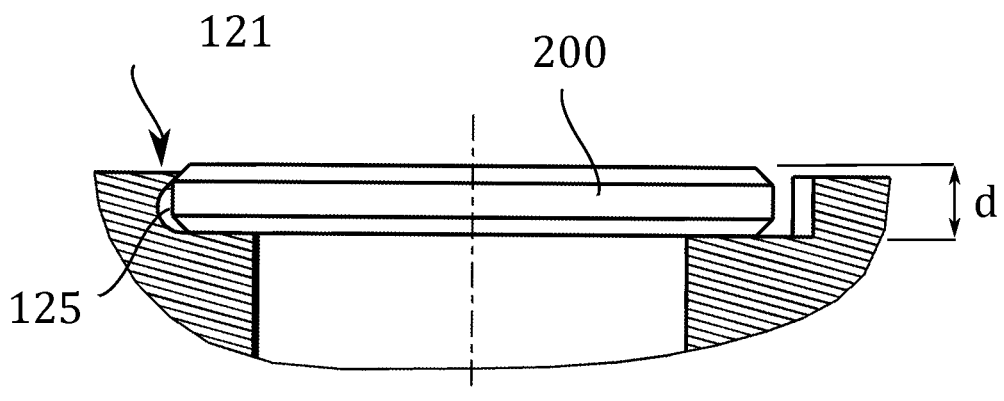
FIG. 5 is an enlarged section view of part of the holding apparatus of FIG. 4.
Figure 6:
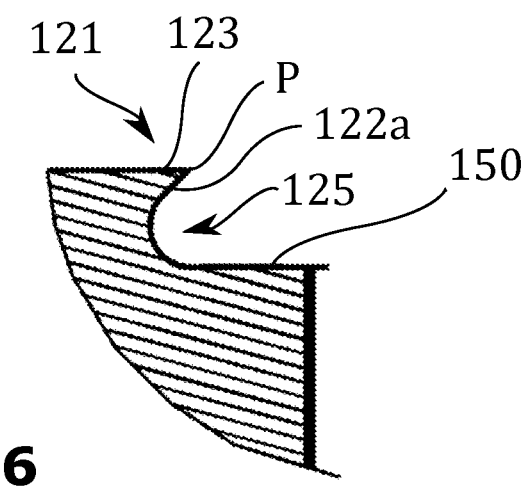
FIG. 6 shows part of the portion shown in FIG. 5.

In addition, it is also apparent here that holding apparatus 100 does not project beyond sample carrier 200 in terms of height, i.e. that the extent of holding apparatus 100 perpendicularly to sample carrier support surface 150 is no greater than the thickness d of sample carrier 200, as shown in FIG. 5.

First sample carrier holding means 121 are furthermore adapted to the round shape of sample carrier 200. In particular, first sample carrier holding means 121 here each comprise two portions 121a and 121b that are arranged alongside a second recess 141. A grasping tool can fit in second recess 141 upon introduction or withdrawal of sample carriers, as will be explained in further detail later.

Holding apparatus 100 furthermore comprises two second sample carrier holding means 131 that here each comprise a spring, in particular a leaf spring. In the instance shown, the two leaf springs 131 are embodied as part of a plate 130. A plate 130 of this kind, which is made of a suitable, i.e. resilient, material, can be embodied correspondingly for this purpose.

A hole is provided in plate 130 so that plate 130, and thus the two leaf springs 131, can be fastened onto body 110 by means of a screw 135. It is understood that other fastening means can also be used, or that the leaf springs can also be fastened individually.

Figure 7:
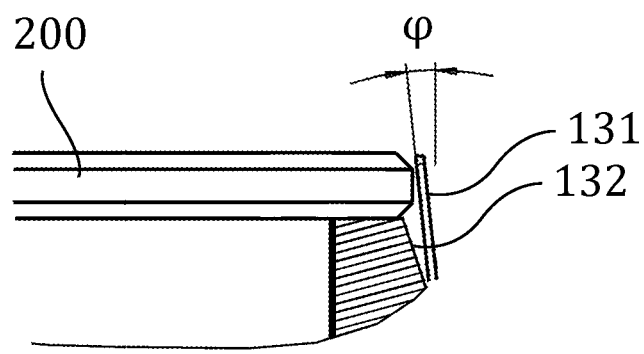
FIG. 7 is an enlarged section view of a further part of the holding apparatus of FIG. 4.

It is also clearly evident from what is shown in FIG. 1, and in particular also in FIG. 7, that leaf springs 131 are deflected toward second holding means 121, for example between approximately 5° and 7°, with respect to the remainder of plate 130. This is shown in FIG. 7 by way of the angle φ. Corresponding recesses 132 are also provided for this purpose in body 110. As a result, leaf springs 131 can each exert a force on a sample carrier 200 abutted against sample carrier support surface 150 with a force component not only toward first sample carrier holding means 121 but also toward sample carrier support surface 150, and can thereby securely retain the respective sample carriers, as is evident from FIGS. 2 and 3.

The angle included between leaf springs 131 and the remainder of plate 130 when a sample carrier is introduced can, in particular, be smaller than with no sample carrier introduced, so as to ensure exertion of a force when a sample carrier is introduced. The sample carrier can thereby be pressed against sample carrier support surface 150 not only by means of first sample carrier holding means 121 but also by means of second sample carrier holding means 131.

At the same time, however, the respective leaf spring 131 can also be pressed in a direction away from the corresponding first holding means 121 when a corresponding force is exerted (externally) on the respective leaf spring 131. This can be advantageous in particular upon positioning or introduction of a sample carrier, but also upon withdrawal.

Figure 8:
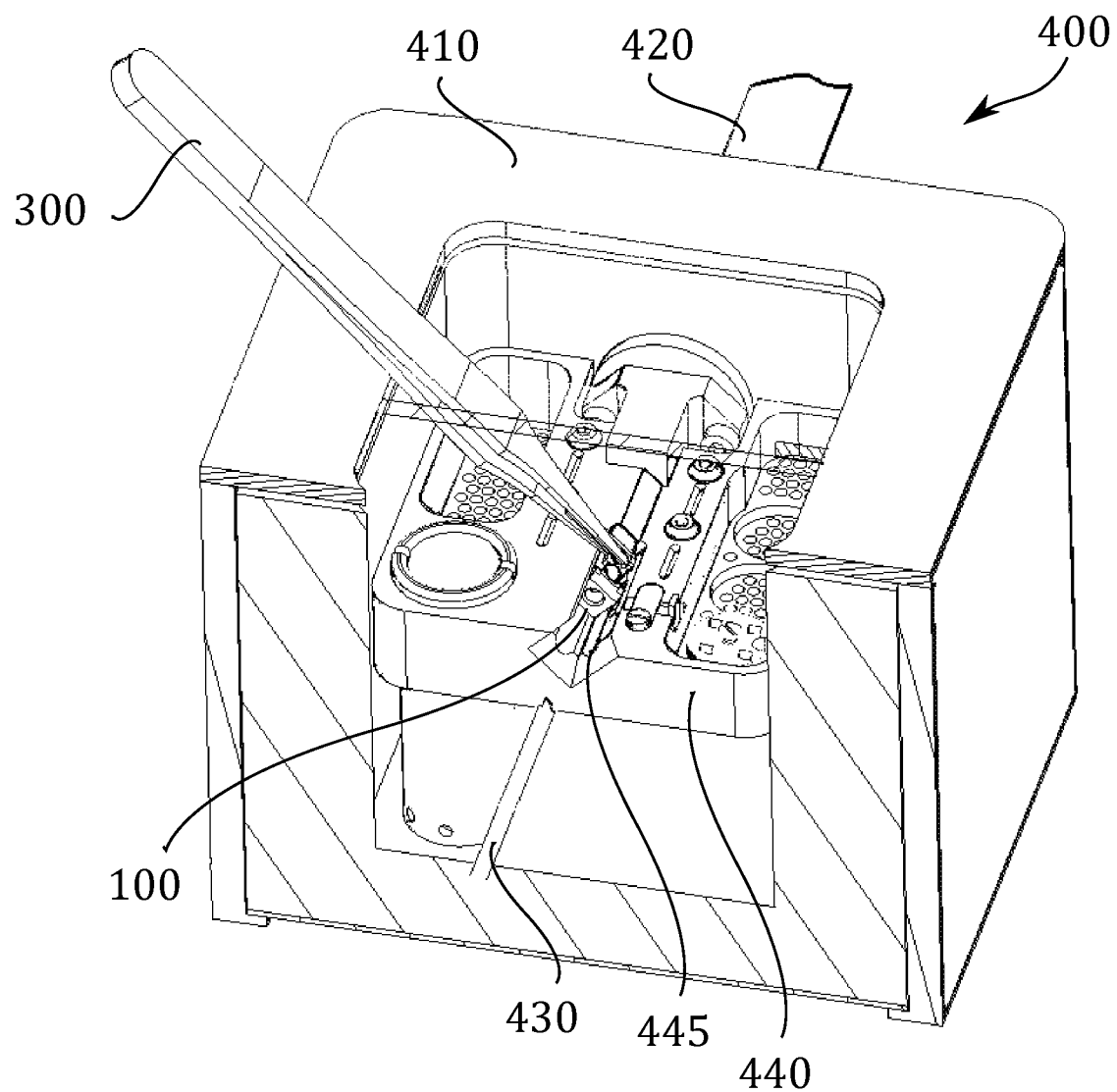
FIG. 8 shows an arrangement according to the present invention having a manipulation container and holding apparatus, in a preferred embodiment.

FIG. 8 schematically depicts an arrangement having a manipulation container 400 and a holding apparatus 100, in a preferred embodiment. Manipulation container 400 comprises a partition 410 and can be held and moved, for example, by means of a handle 420.

Provided in manipulation container 400 is a manipulation holder 445 that comprises a guide 445 into which holding apparatus 100 can be introduced and immobilized. When the holding apparatus is immobilized, a sample carrier can be introduced into holding apparatus 100 or withdrawn from holding apparatus 100, for example, by means of a grasping tool 300, here in the form of a forceps.

Also provided is a manipulator 430 that can be moved, for example, along an axis in which, by way of example, handle 420 is also located. Manipulator 430 can be part of manipulation apparatus 400. Manipulator 430 can furthermore, for example, be mounted onto holding apparatus 100 so that holding apparatus 100 can be mounted onto manipulator 430 by means of receptacle 160, as is apparent e.g. from FIGS. 1 and 2. Holding apparatus 100 can then be moved therewith. It is also conceivable for holding apparatus 100 to be withdrawn from manipulation container 400, or introduced into it, through a suitable opening.

Be it noted that the manipulation apparatus—both in isolation and when located in the manipulation container, depending on the situation—can be moved back and forth between various devices in order to carry out various processes using various devices.

FIGS. 9A-9D depict execution of a preferred embodiment of a method according to the present invention, schematically and from top to bottom, with reference to four illustrations. Firstly, a sample carrier 200 can be grasped with a forceps 300.

It is also apparent from the first illustration (FIG. 9A) that sample carrier 200 can comprise a mount 210 that is embodied here in particular annularly, and a grid 220; a sample can be placed onto the latter.

As is evident from the second illustration (FIG. 9B), sample carrier 200 can then be pressed by means of the forceps in direction R1 against the corresponding leaf spring 131. The sample carrier should be held obliquely, for example at an angle of approximately 5°, as is also indicated by the oblique arrow associated with R1. Leaf spring 131 becomes slightly pressed aside by the first holding means in this process.

Figure 9A:
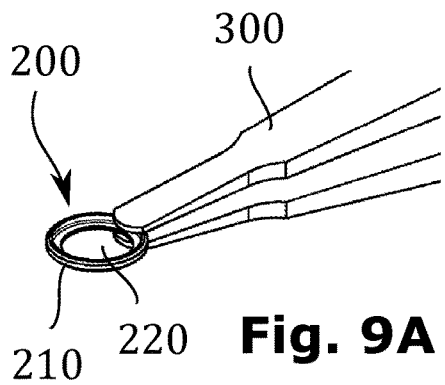
FIGS. 9A-9D show execution of a method according to the present invention, in a preferred embodiment.
Figure 9B:
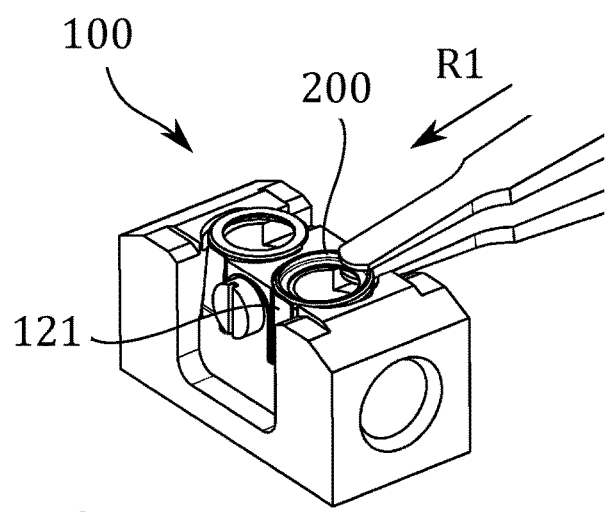
Figure 9C:
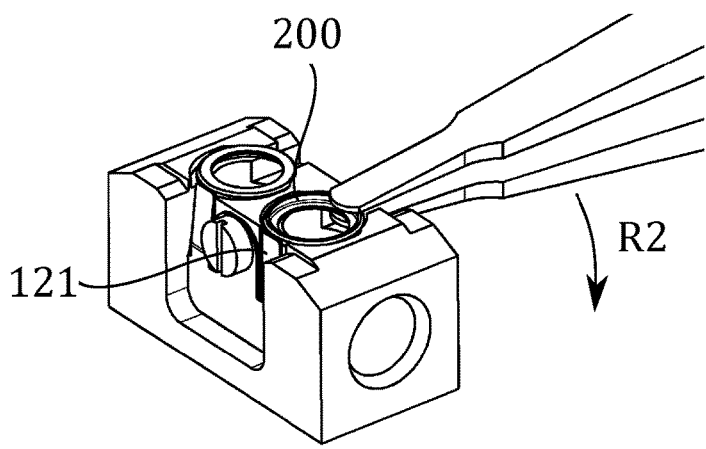
Figure 9D:
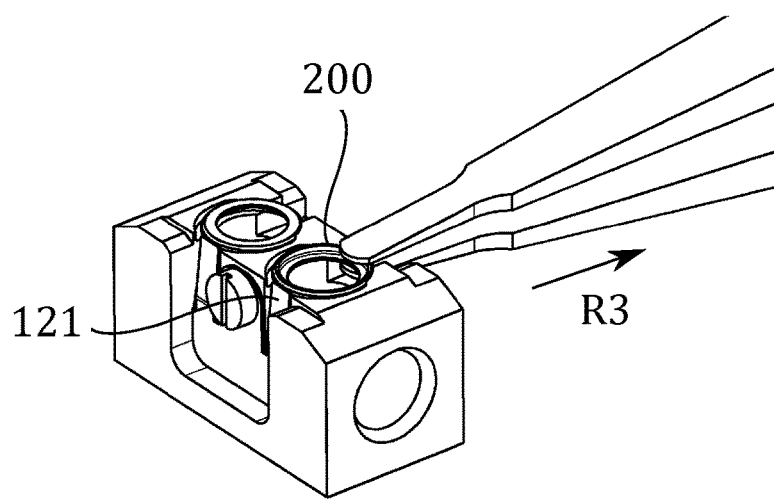

Sample carrier 200 can then be lowered in direction R2 as shown in the third illustration (FIG. 9C), i.e. the sample carrier can then be placed on the sample carrier support surface. In that context, the forceps fits into second recess 141 shown, for example, in FIG. 1. Sample carrier 200 can then be pulled against the first sample carrier holding means, here in direction R3, as is evident from the fourth illustration (FIG. 9D). Leaf spring 131 relaxes slightly, and the sample carrier is pressed into or against the first sample carrier holding means. As a result of the particular configuration, already described, of the first and second sample carrier holding means, the sample carrier can also, in particular, be pressed onto the sample carrier support surface.

The sample carrier is thereby held securely in the holding apparatus. The aforementioned steps can be carried out in reverse order for removal of sample carrier 200 from the holding apparatus.

As is evident from the Figures, the sample carrier, at least in the form shown here, can be placed into the holding apparatus on both sides. Care should nevertheless be taken that that side of the sample carrier on which the grid is mounted faces upward, i.e. away from the sample carrier support surface. Better observation by means of a microscope is thereby possible.

What is claimed is:

1. A holding apparatus for sample carriers for use in cryomicroscopy, the holding apparatus comprising:
   a body having a sample carrier receptacle comprising a sample carrier support surface against which a sample carrier is abuttable;
   a first sample carrier holding means; and
   a second sample carrier holding means configured to impinge upon a sample carrier (200) which is abutting against the sample carrier support surface;
   wherein the second sample carrier holding means impinges upon the abutting sample carrier with force urging the abutting sample carrier against the first sample carrier holding means;
   wherein the first sample carrier holding means is defined by at least part of an inner wall of the sample carrier receptacle;
   wherein the first sample carrier holding means includes at least one first recess into which the abutting sample carrier is partly introducible;
   wherein the at least one first recess is in the form of an undercut;
   wherein the at least one first recess remains at least partly exposed when the sample carrier is abutting, and an abutment surface of the at least one first recess for contacting the abutting sample carrier faces in a direction intersecting the sample carrier support surface at an acute angle and is connected to the sample carrier support surface by a curved surface;
   wherein the first sample carrier holding means includes at least one projection whose inner surface serves at least in part as the sample carrier abutment surface; and
   wherein the sample carrier is held by the first sample carrier holding means such that a force component acts on the sample carrier in a direction parallel to the sample carrier support surface and another force component acts on the sample carrier in a direction perpendicular to the sample carrier support surface.

2. The holding apparatus according to claim 1, wherein the second sample carrier holding means comprises a spring.

3. The holding apparatus according to claim 2, wherein the spring is a leaf spring.

4. The holding apparatus according to claim 1, wherein the body includes a second recess arranged such that the abutting sample carrier is graspable by means of a grasping tool.

5. The holding apparatus according to claim 4, wherein the first sample carrier holding means comprises at least two portions arranged alongside the second recess in the body.

6. The holding apparatus according claim 1, wherein a height of the body extending perpendicular to the sample carrier support surface is no greater than a thickness of the abutting sample carrier.

7. The holding apparatus according to claim 1, wherein the sample carrier receptacle is configured such that the abutting sample carrier abuts with at least 10% of a surface facing toward the sample carrier support surface.

8. The holding apparatus according to claim 1, wherein the sample carrier receptacle is configured such that a mount of the abutting sample carrier abuts against the sample carrier support surface, wherein said mount abuts with at least 20% of a surface facing toward the sample carrier support surface.

9. The holding apparatus according to claim 1, wherein the second sample carrier holding means is configured to be pressed away from the first sample carrier holding means upon positioning of a sample carrier in the sample carrier receptacle.

10. The holding apparatus according to claim 1, wherein the sample carrier receptacle is configured to receive annular sample carriers.

11. The holding apparatus according to claim 1, wherein the body has at least two sample carrier receptacles.

12. The holding apparatus according to claim 1, wherein a largest dimension of the holding apparatus is less than 50 mm.

13. The holding apparatus according to claim 1, wherein the body includes a manipulator receptacle for receiving a manipulator for moving the holding apparatus.

14. An apparatus comprising:
a holding apparatus for sample carriers for use in cryo-microscopy, the holding apparatus including (i) a body having a sample carrier receptacle that comprises a sample carrier support surface against which a sample carrier is abuttable, (ii) a first sample carrier holding means, and (iii) a second sample carrier holding means configured to impinge upon a sample carrier which is abutting against the sample carrier support surface with force urging the abutting sample carrier against the first sample carrier holding means, wherein the body further has a manipulator receptacle, wherein the first sample carrier holding means is defined by at least part of an inner wall of the sample carrier receptacle, wherein the first sample carrier holding means includes at least one first recess into which the abutting sample carrier is partly introducible, wherein the at least one first recess is in the form of an undercut, and wherein the at least one first recess remains at least partly exposed when the sample carrier is abutting, and an abutment surface of the at least one first recess for contacting the abutting sample carrier faces in a direction intersecting the sample carrier support surface at an acute angle and is connected to the sample carrier support surface by a curved surface;
wherein the first sample carrier holding means includes at least one projection whose inner surface serves at least in part as the sample carrier abutment surface; and
wherein the sample carrier is held by the first sample carrier holding means such that a force component acts on the sample carrier in a direction parallel to the sample carrier support surface and another force component acts on the sample carrier in a direction perpendicular to the sample carrier support surface;
a manipulation container in which the holding apparatus can be immobilized; and
a manipulator receivable by the manipulator receptacle to mount the holding apparatus on the manipulator, wherein the manipulator is operable to move the holding apparatus.

15. A method for introducing a sample carrier into a holding apparatus, the holding apparatus comprising (i) a body having a sample carrier receptacle that comprises a sample carrier support surface against which a sample carrier is abuttable, (ii) a first sample carrier holding means, and (iii) a second sample carrier holding means configured to impinge upon a sample carrier which is abutting against the sample carrier support surface with force urging the abutting sample carrier against the first sample carrier holding means, the method comprising the steps of:
grasping the sample carrier by means of a grasping tool;
pressing the sample carrier against the second sample carrier holding means such that the second sample carrier holding means is pressed away from the first sample carrier holding means;
abutting the sample carrier against the sample carrier support surface; and
moving the sample carrier onto the first sample carrier holding means until the sample carrier comes to a stop against the first sample carrier holding means;
wherein the first sample carrier holding means is defined by at least part of an inner wall of the sample carrier receptacle, wherein the first sample carrier holding means includes at least one first recess into which the abutting sample carrier is partly introducible, wherein the at least one first recess is in the form of an undercut, and wherein the at least one first recess remains at least partly exposed when the sample carrier is abutting, and an abutment surface of the at least one first recess for contacting the abutting sample carrier faces in a direction intersecting the sample carrier support surface at an acute angle and is connected to the sample carrier support surface by a curved surface
and wherein the first sample carrier holding means includes at least one projection whose inner surface serves at least in part as the sample carrier abutment surface; and
wherein the sample carrier is held by the first sample carrier holding means such that a force component acts on the sample carrier in a direction parallel to the sample carrier support surface and another force component acts on the sample carrier in a direction perpendicular to the sample carrier support surface.

* * * * *